(12) United States Patent
Xing et al.

(10) Patent No.: US 11,422,174 B2
(45) Date of Patent: Aug. 23, 2022

(54) FREQUENCY MEASUREMENT METHOD AND FREQUENCY MEASUREMENT APPARATUS

(71) Applicant: Schneider Electric Industries SAS, Rueil-Malmaison (FR)

(72) Inventors: Jinlei Xing, Shanghai (CN); Shanshan Luo, Shanghai (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 225 days.

(21) Appl. No.: 16/829,187

(22) Filed: Mar. 25, 2020

(65) Prior Publication Data

US 2020/0309830 A1 Oct. 1, 2020

(30) Foreign Application Priority Data

Mar. 26, 2019 (CN) .......................... 201910231301.8

(51) Int. Cl.
*G01R 23/16* (2006.01)
*G01R 23/02* (2006.01)
*G01R 25/00* (2006.01)

(52) U.S. Cl.
CPC ............. *G01R 23/16* (2013.01); *G01R 23/02* (2013.01); *G01R 25/00* (2013.01)

(58) Field of Classification Search
CPC ........ G01R 23/16; G01R 23/02; G01R 25/00; G01R 19/2513; G01R 31/343; H02J 13/00
USPC ................. 324/76.19, 76.12, 76.11
See application file for complete search history.

(56) References Cited

U.S. PATENT DOCUMENTS

| 5,832,414 A | 11/1998 | Hart et al. |
| 2007/0136013 A1 | 6/2007 | Premerlani et al. |
| 2007/0199386 A1* | 8/2007 | Kuroda ............... G01R 31/2817 73/774 |

(Continued)

FOREIGN PATENT DOCUMENTS

CN 108614155 A 10/2018

OTHER PUBLICATIONS

Indian Patent Office Examination Report dated Apr. 12, 2021 for the corresponding Indian Patent Application No. 202044012993, 5 pages.

(Continued)

*Primary Examiner* — Giovanni Astacio-Oquendo
(74) *Attorney, Agent, or Firm* — Locke Lord LLP

(57) ABSTRACT

A frequency measurement method is provided, which comprising: sampling a voltage to be measured with a fixed sampling frequency; obtaining a positive-sequence voltage angle change amount for a predetermined operation interval time by using a sampling sample obtained by the sampling and based on a discrete Fourier transform (DFT) calculation; obtaining a frequency offset amount by using the positive-sequence voltage angle change amount; and obtaining a frequency-related measurement value by using the frequency offset amount. A frequency measurement apparatus is also provided. measurement value. This frequency measurement method does not require iterative calculations, and directly obtains frequency-dependent measurement values, thereby responding quickly to frequency changes. In addition, a frequency measurement apparatus is also provided.

9 Claims, 3 Drawing Sheets

(56) References Cited

U.S. PATENT DOCUMENTS

| | | | |
|---|---|---|---|
| 2010/0019758 A1* | 1/2010 | Seki | G01R 19/2513 |
| | | | 324/76.39 |
| 2014/0032143 A1 | 1/2014 | Luo | |
| 2014/0152331 A1* | 6/2014 | Wagoner | G01R 27/16 |
| | | | 324/705 |
| 2021/0028774 A1* | 1/2021 | Daher | H03L 5/00 |
| 2021/0146469 A1* | 5/2021 | Wang | B33Y 30/00 |
| 2021/0281154 A1* | 9/2021 | Xu | H02P 23/03 |

OTHER PUBLICATIONS

Dawei Fan et al., "Least-Squares Estimation in Phasor-Based Synchronized Frequency Measurements", Power and Energy Society General Meeting—Conversion and Delivery of Electrical Energy in the 21st Century, IEEE, Piscataway, NJ, USA, Jul. 20, 2008, pp. 1-6.
Extended European Search Report for European Application No. 20305321.0-1010 [sic: 20165688.1] dated Aug. 7, 2020, 11 pages.

* cited by examiner

FREQUENCY MEASUREMENT METHOD AND FREQUENCY MEASUREMENT APPARATUS

The application claims priority to the Chinese patent application No. 201910231301.8, filed on Mar. 26, 2019, the entire disclosure of which is incorporated herein by reference as part of the present application.

FIELD OF INVENTION

The present disclosure relates to a frequency measurement apparatus and a frequency measurement method. The present disclosure relates to a frequency measurement apparatus and a frequency measurement method for measuring a frequency parameter value of a power system.

BACKGROUND

Intelligent electronic devices (IED) of power systems, such as relay protection device and stability control device, usually need to accurately measure electric quantities, such as current, voltage, frequency, and the rate of change of frequency (ROCOF), of the power system. Conventional signal process schemes for LEDs usually use the digital phase-locked loop principle to measure the system frequency in real time and dynamically adjust the sampling frequency of the signal to ensure the measurement accuracy of electric quantities. Because the digital phase-locked loop adopts iterative calculation and successive approximation algorithms when responding to system frequency changes, it needs a frequency response time, and often cannot meet the performance requirements of protection for a fast frequency change rate such as startup within 100 ms.

SUMMARY OF THE INVENTION

Some embodiments of the present disclosure provide a frequency measurement method, including: sampling a voltage to be measured with a fixed sampling frequency; obtaining a positive-sequence voltage angle change amount for a predetermined operation interval time by using a sampling sample obtained by the sampling and based on a Discrete Fourier Transform (DFT) calculation; obtaining a frequency offset amount by using the positive-sequence voltage angle change amount; and obtaining a frequency-related measurement value by using the frequency offset amount. The frequency-related measurement value includes at least one of a group consisting of a frequency measurement value and a frequency change rate measurement value. The frequency offset amount is a difference between a rated frequency and the frequency measurement value.

This frequency measurement method adopts an "open-loop" structure, using the positive-sequence voltage as the frequency measurement input, and using the characteristics of "a positive-sequence voltage angle change amount calculated by two adjacent DFT calculations only depends on the difference between the real-time frequency and the rated frequency". Without iterative calculation, the frequency-dependent measurement value is directly obtained, so as to quickly respond to frequency changes.

For example, in some embodiments, obtaining a positive-sequence voltage angle change amount for a predetermined operation interval time by using a sampling sample obtained by the sampling and based on Discrete Fourier Transform (DFT) calculation includes: obtaining voltage vectors by performing a windowing process and a DFT process on the sampling sample; and calculating the positive-sequence voltage angle change amount based on the voltage vectors.

The sample obtained by using a window function to intercept sampling can be beneficial to filter or suppress harmonics. In the case of harmonic interferences, the measured values of frequency and frequency change rate still have high accuracy.

For example, in some embodiments, the frequency-related measurement value includes the frequency change rate measurement value. The method further includes: comparing the frequency change rate measurement value with a threshold change rate, updating the frequency-related measurement value when the frequency change rate measurement value is less than the threshold change rate; stopping updating the frequency-related measurement value when the frequency change rate measurement value is greater than the threshold change rate, and continuing to update the frequency-related measurement value when each frequency change rate measurement value is greater than the threshold change rate within a consecutive predetermined number of power cycles.

Comparing the frequency change rate measurement value with the threshold change rate to adjudge the abrupt-change in voltage phase angle is beneficial to remove abnormal frequency-related measured values in the presence of external disturbances, and to ensure the accuracy and reliability of the updated frequency value of the voltage to be measured.

For example, in some embodiments, the method further includes: obtaining a resampling frequency by using the frequency-related measurement value; performing a resampling on the sampling sample by using the resampling frequency; and obtaining other electric quantity measurement values in addition to the frequency-related measurement value by using the resampling sample obtained by the resampling and based on a DFT calculation.

In order to ensure the measurement accuracy of electric quantities such as current and voltage, based on the real-time measurement frequency, the sampling values of current and voltage are resampled to ensure the measurement accuracy of electric quantities such as current and voltage.

For example, in some embodiments, obtaining the frequency offset amount by using the positive-sequence voltage angle change amount and based on the following formula: frequency offset amount=positive-sequence voltage angle offset amount/($2\pi T$), where T is the predetermined operation interval time.

Some embodiments of the present disclosure provide a frequency measurement apparatus, including an open-loop structure for frequency measurement. The open-loop structure includes: a sampling unit, which is configured to sample a voltage to be measured with a fixed sampling frequency; a positive-sequence voltage calculation unit, which is configured to obtain a positive-sequence voltage angle change amount for predetermined operation interval time by using a sampling sample obtained by the sampling and based on a DFT calculation; and a frequency calculation unit, which is configured to obtain a frequency offset amount by using the positive-sequence voltage angle change amount, and to obtain a frequency-related measurement value by using the frequency offset amount. The frequency-related measurement value includes at least one of a group consisting of a frequency measurement value and a frequency change rate measurement value, and the frequency offset amount is a difference between a rated frequency and the frequency measurement value.

For example, in some embodiments, the positive-sequence voltage calculation unit including: a window unit, which is configured to perform a windowing process on the sampling sample; a DFT unit, which is configured to obtain voltage vectors by performing a DFT process on the sampling sample after the windowing process; and a positive-sequence voltage angle calculation unit, which is configured to calculate the positive-sequence voltage angle change amount based on the voltage vectors.

For example, in some embodiments, the frequency-related measurement value includes a frequency change rate measurement value. The frequency calculation unit further includes a phase angle abrupt-change judgment unit, which is configured to compare the frequency change rate measurement value with a threshold change rate. The phase angle abrupt-change judgment unit is configured to update the frequency-related measurement value when the frequency change rate measurement value is less than the threshold change rate. The phase angle abrupt-change judgment unit is configured to stop updating the frequency-related measurement value when the frequency change rate measurement value is greater than the threshold change rate, and continuous to update the frequency-related measurement value when each frequency change rate measurement value is greater than the threshold change rate within a consecutive predetermined number of power cycles.

For example, in some embodiments, the apparatus further includes: a resampling unit, which is configured to resample the sampling sample based on the frequency-related measurement value; and an electric quantity calculation unit, which is configured to obtain other electric quantity measurement values in addition to the frequency-related measurement value by using the resampling sample obtained by the resampling and based on a DFT calculation.

For example, in some embodiments, the frequency-related measurement value includes the frequency measurement value. The frequency calculation unit includes: a multiplier, which is configured to multiply the positive-sequence voltage angle change amount by a reciprocal of the predetermined operation interval time to obtain the frequency offset amount; and an adder, which is configured to add the frequency offset amount with the rated frequency to obtain the frequency-related measurement value.

BRIEF DESCRIPTION OF THE PREFERRED EMBODIMENTS

Figure 1:
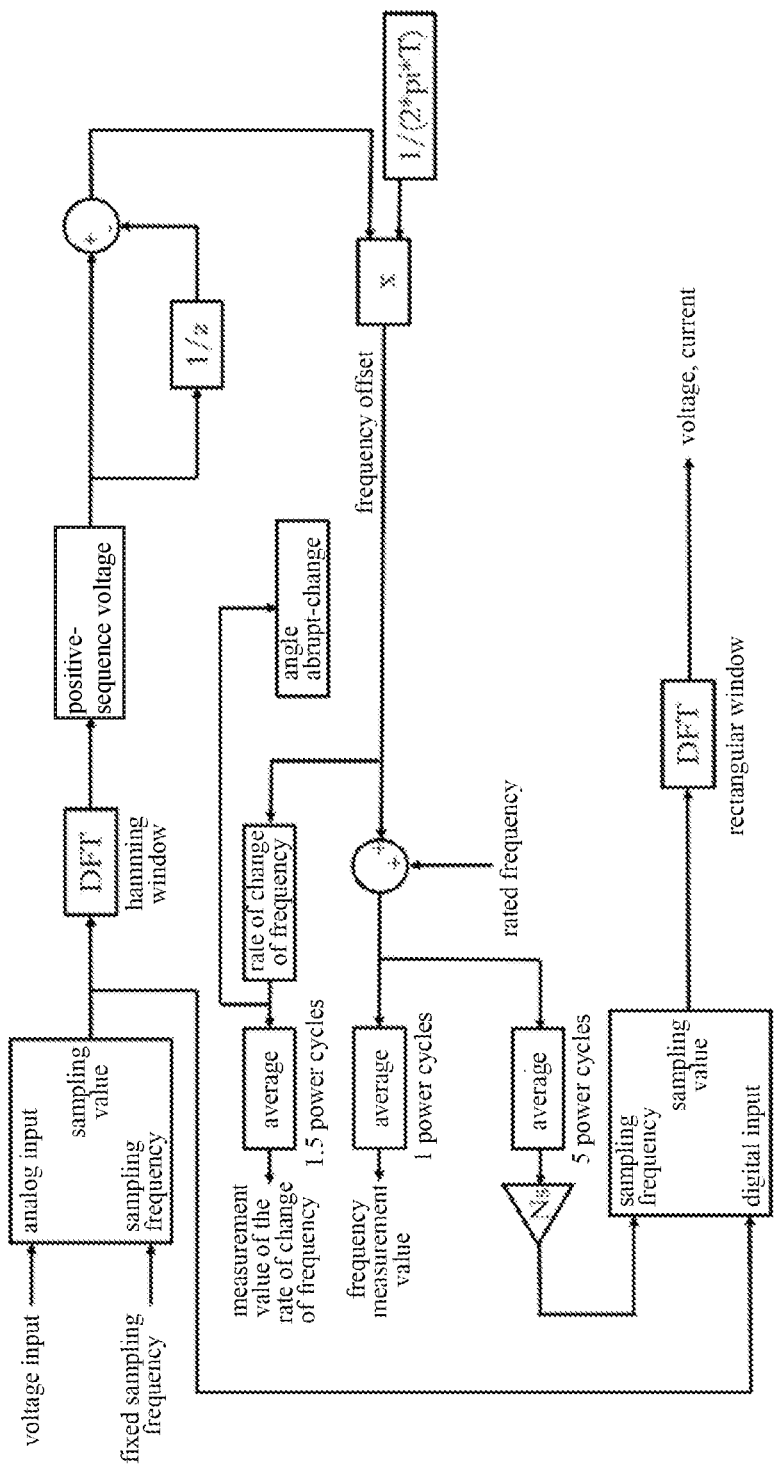
FIG. 1 is a schematic circuit diagram of a frequency measurement apparatus according to an embodiment of the present disclosure.
Figure 2:
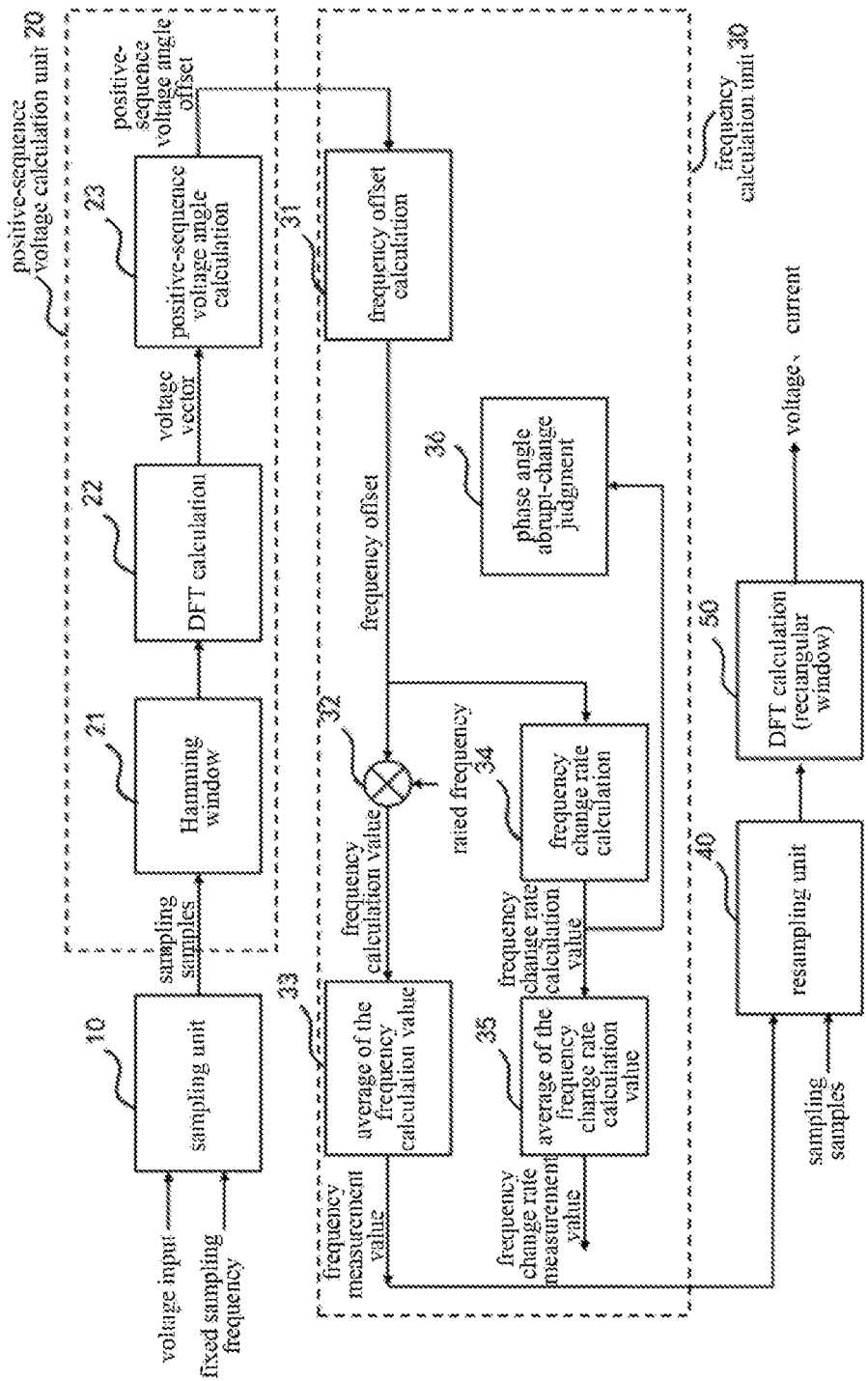
FIG. 2 is a structural block diagram of a frequency measurement apparatus according to an embodiment of the present disclosure.

FIG. 1 is a schematic circuit diagram of a frequency measurement apparatus according to an embodiment of the present disclosure, and FIG. 2 is a structural block diagram of a frequency measurement apparatus according to an embodiment of the present disclosure. As shown in FIGS. 1 and 2, the frequency measurement apparatus according to the embodiments of the present disclosure has an open-loop structure for frequency measurement. The open-loop structure includes a sampling unit 10, a positive-sequence voltage calculation unit 20, and a frequency calculation unit 30.

The sampling unit 10 samples the voltage to be measured with a fixed sampling frequency to obtain sampling samples. The fixed sampling frequency can be 2400 Hz, 2880 Hz, 4000 Hz or 4800 Hz and the like.

The positive-sequence voltage calculation unit 20 obtains a positive-sequence voltage angle change amount by using the sampling samples obtained by the sampling and based on a DFT calculation.

The frequency calculation unit 30 uses the positive-sequence voltage angle change amount to obtain a frequency offset amount, and uses a rated frequency and the frequency offset amount to obtain frequency-related measurement values. Here, the frequency-related measurement values include a frequency change rate measurement value and a frequency measurement value. The positive-sequence voltage angle change amount is the positive-sequence voltage angle change amount for predetermined time interval T. The positive-sequence voltage angle change amount for the predetermined time interval T may be, for example, the amount of change in positive-sequence voltage angle for two adjacent DFT calculations.

Due to the open-loop structure, no iterative calculations are required, the frequency-related measurement values are directly obtained, thereby achieving a fast frequency response.

The positive-sequence voltage calculation unit 20 includes a window unit 21, a DFT unit 22, and a positive-sequence voltage angle calculation unit 23. The window unit 21 performs a windowing process on the sampling samples, that is, intercepts the sampling samples by using a window function. The window function is preferably a hamming window function or a hanning window function to suppress the effects of harmonics. The DFT unit 22 performs a DFT process on the sampling samples after the windowing process to obtain voltage vectors. The positive-sequence voltage angle calculation unit 23 calculates a positive-sequence voltage angle change amount based on the voltage vectors.

Because the window function is used to perform the windowing process on the sampling samples, the effects of harmonics can be effectively suppressed or eliminated.

The frequency calculation unit 30 includes a frequency offset calculation unit 31, a frequency value calculation unit 32, and a frequency change rate value calculation unit 34. The frequency offset calculation unit 31 may be a multiplier, which multiplies the positive-sequence voltage angle change amount obtained by the positive-sequence voltage calculation unit 20 by a reciprocal of the predetermined operation interval to obtain the frequency offset amount. Specifically, see the following Formula 1. The frequency value calculation unit 32 may be an adder, which adds the frequency offset amount and the rated frequency to obtain a frequency calculation value. Specifically, see the following Formula 2. In some embodiments, the frequency calculation value may be used as the frequency measurement value. The frequency change rate value calculation unit 34 obtains a frequency change rate calculation value by using the frequency offset amount. In some embodiments, the frequency change rate calculation value may be used as the frequency change rate measurement value, which indicates how fast the frequency changes with time. The frequency change rate value calculation unit 34 may include a subtractor and a multiplier, which may, for example, calculate a real-time frequency change rate, or the frequency change rate calculation value, based on two adjacent frequency offsets.

$$\text{frequency offset amount} = \text{positive-sequence voltage angle offset amount}/(2\pi T) \quad \text{Formula 1}$$

$$\text{frequency calculation value} = \text{rated frequency} + \text{frequency change amount} \quad \text{Formula 2}$$

where, T is the predetermined DFT operation interval corresponding to the positive-sequence voltage angle offset amount, which may be, for example, 5 ms, 10 ms, or 20 ms and the like.

In addition, in some embodiments, for example, the frequency calculation unit 30 further includes a frequency average calculation unit 33 and a frequency change rate average calculation unit 35. The frequency average calculation unit 33 averages the obtained frequency calculation values in several power cycles (for example, 1.5 power cycles), and then obtains the frequency measurement value. The frequency change rate average calculation unit 35 averages the frequency change rate calculation values obtained by the frequency change rate calculation unit 34 in several power cycles (for example, one power cycle), and then obtains the frequency change rate measurement value.

In addition, in some embodiments, for example, the frequency calculation unit 30 further includes a phase angle abrupt-change judgment unit 36, which judges the phase angle abrupt-change to stop updating the frequency-related measurement values in the case of external disturbance, eliminating the influence of the abnormal frequency-related measurement values to ensure the accuracy of frequency measurement. Specifically, if the measured frequency change rate is less than the threshold change rate, the phase angle abrupt-change judgment unit 36 is configured to judge that no phase angle abrupt-change has occurred and update the frequency-related measurement values. For example, the phase angle abrupt-change judgment unit 36 may control the frequency calculation unit 30 to update the frequency-related measurement values. If the frequency change rate measurement value is greater than the threshold change rate, the phase angle abrupt-change judgment unit 36 is configured to judge that the phase angle abrupt-change has occurred and stop updating the frequency-related measurement values. For example, the phase angle abrupt-change judgment unit 36 may control the frequency calculation unit 30 to stop updating the frequency-related measurement values. Further, if each measured frequency change rate is greater than the threshold change rate within a consecutive predetermined number of power cycles (for example, two power cycles), the phase angle abrupt-change judgment unit 36 is configured to judge that no phase angle abrupt-change has occurred and continue to be used for updating the frequency-related measurement values. The threshold change rate may be, for example, 10 Hz/s.

As shown in FIG. 2, the phase angle abrupt-change judgment unit 36 may receive the frequency change rate calculation value(s) from the frequency change rate value calculation unit 34 for determining the phase angle abrupt-change, but is not limited thereto. For example, the phase angle abrupt-change judgment unit 36 may independently calculate the frequency change rate.

In addition, the frequency measurement apparatus may further include a resampling unit 40 and an electric quantity calculation unit 50. The resampling unit 40 resamples the original sampling samples based on the frequency-related measurement values. The electric quantity calculation unit 50 obtains other electric quantity measurement values, such as voltage and current measurement values, by using the resampling samples obtained by the resampling, and based on a DFT calculation.

The resampling unit 40 resampling the sampling samples based on the frequency-related measurement values includes calculating a resampling frequency based on the following Formula 3 and resampling the sampling samples using the resampling frequency.

$$\text{Resampling frequency} = \text{frequency measurement value} \times Ns \quad \text{Formula 3}$$

where, Ns is a constant, for example, 48 or 24. In addition, the frequency calculation values can be averaged over several power cycles (for example, 5) to obtain the frequency measurement value.

Obtaining other electric quantity measurement values by using the resampling samples obtained by the resampling and based on the DFT calculation includes performing a windowing process and a DFT process on the resampling samples to obtain other electric quantity measurement values such as voltage and current and the like. Here, the window function used in the windowing process may be a rectangular window function.

Hereinafter, the frequency measurement method according to the present disclosure will be described with reference to FIGS. 3-4.

Figure 3:
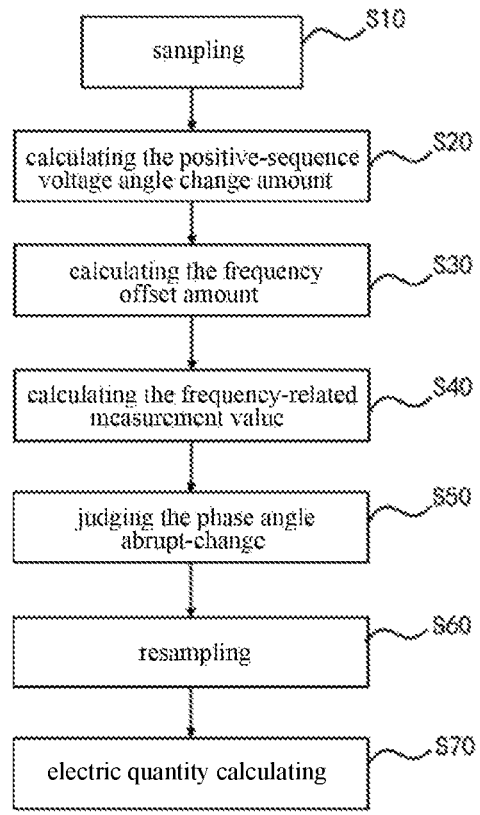
FIG. 3 is a flowchart of a frequency measurement method according to an embodiment of the present disclosure.

FIG. 3 is a flowchart of a frequency measurement method according to an embodiment of the present disclosure. As shown in FIG. 3, the frequency measurement method according to an embodiment of the present disclosure includes: S10, sampling step, sampling the voltage to be measured with a fixed sampling frequency; S20, positive-sequence voltage angle change amount calculating step, obtaining the positive-sequence voltage angle change amount for a predetermined operation interval time T by using the sampling samples and based on a DFT calculation; S30, frequency offset calculating step, obtaining a frequency offset amount by using the positive-sequence voltage angle change amount; S40: frequency-related measurement value calculating step, obtaining frequency-related measurement values by using the frequency offset. The frequency-related measurement values include at least one of a group consisting of a frequency measurement value and a frequency change rate measurement value, and the frequency offset amount is the difference between a rated value frequency and frequency measurement value.

This frequency measurement method can be performed by using the frequency measurement apparatus according to the present embodiment described above.

In addition, for example, in the sampling step of S10, the fixed sampling frequency may be 2400 Hz, 2880 Hz, 4000 Hz, or 4800 Hz and the like.

In some embodiments, the positive-sequence voltage angle change amount calculating step of S20 may include obtaining voltage vectors by performing a windowing process and a DFT process on the sampling samples and calculating the positive-sequence voltage angle change amount based on the voltage vectors. The windowing process may include intercepting the sampling samples by using, for example, a Hamming window function or a Hanning window function. The windowing process is beneficial to suppress the effects of harmonics. The predetermined time interval T may be 5 ms, 10 ms, or 20 ms.

In the frequency offset calculating step of S30, for example, the frequency offset amount can be calculated based on the Formula 1 above. In the frequency-related measurement value calculating step of S40, for example, the frequency calculation value can be calculated based on the above Formula 2 and the frequency change rate calculation value can be obtained by using the frequency offset.

In addition, as shown in FIG. 3, the measurement method according to an embodiment of the present disclosure may further include a phase angle abrupt-change judgment step of S50.

Figure 4:
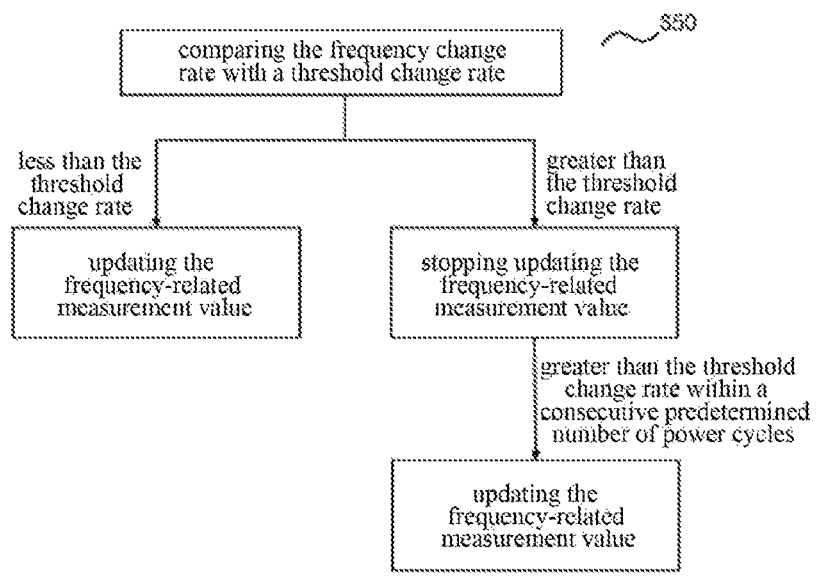
FIG. 4 is an explanatory diagram for explaining a step of judging a phase angle abrupt-change according to an embodiment of the present disclosure.

FIG. 4 shows the phase angle abrupt-change judgment step of S50, which includes comparing the frequency change rate measurement value with a threshold change rate. Specifically, when the frequency change rate measurement value is less than the threshold change rate, the frequency-related measurement value is updated, when the frequency change rate measurement value is greater than the threshold change rate, the frequency-related measurement value is stopped from being updated, and when each frequency change rate measurement value is greater than the threshold change rate within a consecutive predetermined number of power cycles, the frequency-related measurement value will continue to be updated. The threshold change rate may be, for example, 10 Hz/s. The phase angle abrupt-change judgment step is beneficial to eliminate the influence of abnormal frequency-related measurement values and ensure the accuracy of frequency measurement.

In addition, as shown in FIG. 3, the measurement method according to an embodiment of the present disclosure may further include a resampling step of S60 and an electric quantity calculating step of S70. In the resampling step of S60, a resampling frequency is obtained by using the frequency-related measurement values, and the sampling samples is resampled by using the resampling frequency. In the electric quantity calculating step of S70, other electric quantity measurement values in addition to the frequency-related measurement values are obtained by using the resampling samples obtained by the resampling and based on a DFT calculation. The other electric quantity measurement values can be, for example, voltage and current measurement values.

The connection relationship and the composition relationship of each unit in the various embodiments of the present disclosure do not limit the scope of protection of the present disclosure. They can be combined into a single unit to for implementation, or a specific unit therein may be divided into multiple units with smaller functions for implementation.

Each block diagram in the drawings shows a structure, a function, and an operation that a frequency measurement apparatus according to an embodiment of the present disclosure may implement. In this regard, each block in the block diagram may represent a module that contains one or more executable instructions for implementing a specified logical function. In alternative implementations, the functions labeled in the blocks may occur in a different order than those marked in the drawings. For example, two consecutive blocks may actually be executed substantially in parallel, and they may sometimes be executed in the reverse order, depending on the functions involved. It should also be noted that each block in the block diagram may be implemented by a dedicated hardware-based ASIC that performs a prescribed function or action, or may be implemented by a combination of dedicated hardware and computer instructions.

The embodiments of the present disclosure have been described above. The above description is exemplary, not exhaustive, and is not limited to the disclosed embodiments. Many modifications and variations will be apparent to those skilled in the art without departing from the scope and spirit of the various embodiments described. The terminology used herein is chosen to best explain the principles, practical applications or improvements to the technology in the marketplace of the various embodiments, or to enable others of ordinary skill in the art to understand the various embodiments disclosed herein.

The invention claimed is:

1. A frequency measurement method, comprising:
    sampling a voltage to be measured with a fixed sampling frequency;
    obtaining a positive-sequence voltage angle change amount for a predetermined operation interval time by using a sampling sample obtained by the sampling and based on a Discrete Fourier Transform (DFT) calculation;
    obtaining a frequency offset amount by using the positive-sequence voltage angle change amount; and
    obtaining a frequency-related measurement value by using the frequency offset amount,
    wherein the frequency-related measurement value comprises at least one of a group consisting of a frequency measurement value and a frequency change rate measurement value,
    the frequency offset amount is a difference between a rated frequency and the frequency measurement value, and
    the frequency-related measurement value comprises the frequency change rate measurement value,
    the method further comprising:
        comparing the frequency change rate measurement value with a threshold change rate:
        updating the frequency-related measurement value when the frequency change rate measurement value is less than the threshold change rate;
        stopping updating the frequency-related measurement value when the frequency change rate measurement value is greater than the threshold change rate, and continuing to update the frequency-related measurement value when each frequency change rate measurement value is greater than the threshold change rate within a consecutive predetermined number of power cycles.

2. The frequency measurement method according to claim 1, wherein:
    obtaining a positive-sequence voltage angle change amount for a predetermined operation interval time by using a sampling sample obtained by the sampling and based on Discrete Fourier Transform (DFT) calculation comprises:
    obtaining voltage vectors by performing a windowing process and a DFT process on the sampling sample; and
    calculating the positive-sequence voltage angle change amount based on the voltage vectors.

3. The frequency measurement method according to claim 1, further comprising:
    obtaining a resampling frequency by using the frequency-related measurement value;
    performing a resampling on the sampling sample by using the resampling frequency; and
    obtaining other electric quantity measurement values in addition to the frequency-related measurement value by using the resampling sample obtained by the resampling and based on a DFT calculation.

4. The frequency measurement method according to claim 1, wherein:

obtaining the frequency offset amount by using the positive-sequence voltage angle change amount and based on the following formula:

frequency offset amount=positive-sequence voltage angle offset amount/($2\pi T$), where, T is the predetermined operation interval time.

5. A frequency measurement apparatus, comprising:
an open-loop structure for frequency measurement, comprising:
  a sample unit, which is configured to sample a voltage to be measured with a fixed sampling frequency;
  a positive-sequence voltage calculator, which is configured to obtain a positive-sequence voltage angle change amount for predetermined operation interval time by using a sampling sample obtained by the sampling and based on a Discrete Fourier Transform (DFT) calculation; and
  a frequency calculator unit, which is configured to obtain a frequency offset amount by using the positive-sequence voltage angle change amount, and to obtain a frequency-related measurement value by using the frequency offset amount, wherein
  the frequency-related measurement value comprises at least one of a group consisting of a frequency measurement value and a frequency change rate measurement value, and
  the frequency offset amount is a difference between a rated frequency and the frequency measurement value.

6. The frequency measurement apparatus according to claim 5, wherein:
  the positive-sequence voltage calculator comprising:
  a windowing processor, which is configured to perform a windowing process on the sampling sample;
  a Discrete Fourier Transform (DFT) performer, which is configured to obtain voltage vectors by performing a Discrete Fourier Transform (DFT) process on the sampling sample after the windowing process; and
  a positive-sequence voltage angle calculator, which is configured to calculate the positive-sequence voltage angle change amount based on the voltage vectors.

7. The frequency measurement apparatus according to claim 5, wherein:
  the frequency-related measurement value comprises a frequency change rate measurement value,
  the frequency calculator further comprises a phase angle abrupt-change judger, which is configured to compare the frequency change rate measurement value with a threshold change rate:
  the phase angle abrupt-change judger is configured to update the frequency-related measurement value when the frequency change rate measurement value is less than the threshold change rate;
  the phase angle abrupt-change judger unit is configured to stop updating the frequency-related measurement value when the frequency change rate measurement value is greater than the threshold change rate, and continuous to update the frequency-related measurement value when each frequency change rate measurement value is greater than the threshold change rate within a consecutive predetermined number of power cycles.

8. The frequency measurement apparatus according to claim 5, further comprising:
  a resampler, which is configured to resample the sampling sample based on the frequency-related measurement value; and
  an electric quantity calculator, which is configured to obtain other electric quantity measurement values in addition to the frequency-related measurement value by using the resampling sample obtained by the resampling and based on a Discrete Fourier Transform (DFT) calculation.

9. The frequency measurement apparatus according to claim 5, wherein:
  the frequency-related measurement value comprises the frequency measurement value,
  the frequency calculator comprises:
  a multiplier, which is configured to multiply the positive-sequence voltage angle change amount by a reciprocal of the predetermined operation interval time to obtain the frequency offset amount; and
  an adder, which is configured to add the frequency offset amount with the rated frequency to obtain the frequency-related measurement value.

* * * * *